(12) United States Patent
Field et al.

(10) Patent No.: US 7,358,701 B2
(45) Date of Patent: Apr. 15, 2008

(54) METHOD AND SYSTEM FOR MODELING ENERGY TRANSFER

(76) Inventors: Robert B. Field, 393 Callaghan Cres., Oakville, Ontario (CA) L5L 1J9; Peter Michalski, 11 Morning Sun, Irvine, CA (US) 92612; G. Robert Pickering, Sixth Lane Nassagaweya, Acton, Ontario (CA) L7J 2L7; Vladimir S. Palovic, 3396 Artesian Drive, Mississauga, Ontario (CA) L5M 7K3

( * ) Notice: Subject to any disclaimer, the term of this patent is extended or adjusted under 35 U.S.C. 154(b) by 0 days.

(21) Appl. No.: 10/757,220

(22) Filed: Jan. 13, 2004

(65) Prior Publication Data
US 2004/0155661 A1 Aug. 12, 2004

Related U.S. Application Data

(60) Provisional application No. 60/445,511, filed on Feb. 7, 2003.

(51) Int. Cl.
*H02J 7/00* (2006.01)

(52) U.S. Cl. .............. 320/104; 320/132; 320/135; 320/150; 320/153; 320/154; 320/155; 320/130; 324/427

(58) Field of Classification Search .............. 320/104, 320/109, 137, 150, 153, 154, 155, 161
See application file for complete search history.

(56) References Cited

U.S. PATENT DOCUMENTS

| | | | |
|---|---|---|---|
| 3,905,364 A | 9/1975 | Cudahy et al. | 128/2.06 |
| 4,435,675 A * | 3/1984 | Adams | 320/125 |
| 5,202,617 A | 4/1993 | Nor | 320/2 |
| 5,306,999 A | 4/1994 | Hoffman | 320/2 |
| 5,321,627 A | 6/1994 | Reher | 364/483 |
| 5,327,066 A | 7/1994 | Smith | 320/2 |
| 5,349,535 A | 9/1994 | Gupta | 364/483 |
| 5,352,982 A | 10/1994 | Nakazawa et al. | 324/427 |
| 5,394,089 A | 2/1995 | Clegg | 324/427 |

(Continued)

FOREIGN PATENT DOCUMENTS

WO  WO 96/22625  7/1996

OTHER PUBLICATIONS

"The Development of Free Convection Between Heated Vertical Plates", J.R. Bodola and J.F. Osterle; Journal of Heat Transfer, Feb. 1962, pp. 40-44.

(Continued)

*Primary Examiner*—Gary L. Laxton
*Assistant Examiner*—Samuel Berhanu

(57) ABSTRACT

A method and system for modeling or simulating an application environment so as to evaluate the effect of a selected battery and charger in the application environment. Sensors are used to gather data regarding the energy consumption needs of the application environment over time. Based on the energy needs and/or user-specified application environment parameters, such as a charge schedule, a battery size and type, and a charge return model, an energy transfer profile for the application environment is generated and outputted. The energy transfer profile provides an indication of the state of charge of the battery over time based upon the simulated discharging and charging of the battery in the application environment. The generation of the energy transfer profile takes into account the charging schedule and the incremental change in battery parameters over time.

45 Claims, 8 Drawing Sheets

U.S. PATENT DOCUMENTS

| | | | | |
|---|---|---|---|---|
| 5,463,305 A | * | 10/1995 | Koenck | 320/145 |
| 5,487,002 A | | 1/1996 | Diller et al. | 364/424.01 |
| 5,548,200 A | | 8/1996 | Nor et al. | 320/27 |
| 5,563,491 A | | 10/1996 | Tseng | 320/2 |
| 5,565,755 A | | 10/1996 | Keith | 320/2 |
| 5,565,759 A | * | 10/1996 | Dunstan | 320/135 |
| 5,583,418 A | | 12/1996 | Honda et al. | 320/43 |
| 5,594,318 A | | 1/1997 | Nor et al. | 320/2 |
| 5,598,084 A | | 1/1997 | Keith | 320/2 |
| 5,686,812 A | * | 11/1997 | Hotta | 320/134 |
| 5,803,215 A | | 9/1998 | Henze et al. | 191/2 |
| 5,939,861 A | * | 8/1999 | Joko et al. | 320/122 |
| 6,016,047 A | * | 1/2000 | Notten et al. | 320/137 |
| 6,087,805 A | | 7/2000 | Langston et al. | 320/109 |
| 6,137,292 A | * | 10/2000 | Hirsch et al. | 324/427 |
| 6,215,281 B1 | | 4/2001 | Koch | 320/150 |
| 6,326,765 B1 | * | 12/2001 | Hughes et al. | 320/104 |
| 6,495,992 B1 | | 12/2002 | Pavlovic | 320/161 |
| 6,803,746 B2 | * | 10/2004 | Aker et al. | 320/139 |
| 6,965,216 B2 | * | 11/2005 | Pavlovic et al. | 320/157 |

OTHER PUBLICATIONS

"On the Low Rayleith Number Asymptote for Natural Convection Through an Isothermal, Parallel-Plate Channel", L. Martin, G.D. Raithby and M.M. Yovanovich; Journal of Heat Transfer, Nov. 1991, vol. 113, pp. 899-905.

"A General Express for the Correlation of Rates of Transfer and Other Phenomena", S.W. Churchill and R. Usagi; AIChE Journal (vol. 18, No. 6), Nov. 1972, pp. 1122-1128.

International Search Report, PCT/US2004/003613.

* cited by examiner

METHOD AND SYSTEM FOR MODELING ENERGY TRANSFER

CROSS-REFERENCE TO RELATED APPLICATIONS

The present application claims the benefit of U.S. provisional application 60/445,511 filed Feb. 7, 2003, the contents of which are incorporated herein by reference.

FIELD OF THE INVENTION

The present invention relates to modeling energy transfer and, in particular, to modeling the consumption and replacement of energy for a battery.

BACKGROUND OF THE INVENTION

Rechargeable batteries find widespread use in a number of applications. Among the many applications for rechargeable batteries is the use of such batteries in powering electric vehicles, including lift trucks, pallet jacks, tuggers, automated guided vehicles, and other electric powered people and equipment movers found in an industrial setting.

A charger for recharging batteries may be either a simple charger or a closed-loop charger. Simple chargers deliver a low level charge current to the battery over a long period of time. Closed-loop chargers deliver a high current to rapidly charge the battery, and monitor the state of the battery during charging to prevent overcharge. There are a number of methods that may be used to regulate the rapid charging of a battery. The most traditional is a constant current/constant voltage charging algorithm. Another common algorithm is a stepped (IVI) charging algorithm. Other known algorithms are also used to monitor and regulate charging.

With any application environment it is important to ensure that the battery and the charger are appropriate for the anticipated use. Many industrial applications require that electric powered vehicles operate for two or three consecutive shifts at a time without an extended recharging period. There may be various breaks for coffee, meals, or shift changes during which recharging can take place. The cyclical use of equipment in an industrial application means that the energy needs are somewhat consistent over a cycle, that there is a fixed amount of time available for recharging, and that it is important that the equipment remain operating without requiring battery changes. Therefore, it is important to select a battery and charger that are tailored to the particular energy needs and schedule for a particular electric vehicle or industrial use.

Accordingly, a need exists for a system and method for calculating an energy transfer profile based upon a particular application environment and a particular charging model.

SUMMARY OF THE INVENTION

The present invention provides a system and method for modeling or simulating an application environment to analyze the effect of a particular battery and/or charger within the application environment. Data regarding the energy needs of the application environment is gathered over time under operating conditions and is combined with certain application environment parameters, such as a charge return model. The gathered data and application environment parameters are used to model the state of a battery over time and produce an energy transfer profile for the application environment.

In one aspect, the present invention provides a method of modeling energy transfer by way of an energy transfer profile for an application environment utilizing a battery as a power source, the method comprises the steps of: receiving sensor data for the application environment, the sensor data being related to energy consumption over time; receiving one or more charge parameters for the battery; determining the energy transfer profile for the application environment based upon the sensor data, including determining one or more energy needs for the application environment and applying a charge return model based upon the charge parameters; and making available the energy transfer profile.

In another aspect, the present invention provides a method for generating an energy transfer profile for modeling energy transfer in a vehicle utilizing a battery as an energy source, the method comprises the steps of: receiving recorded sensor data for the vehicle relating to energy consumption over time; receiving one or more parameters including a charge parameter through a user interface; calculating the energy transfer profile for the vehicle based upon the recorded sensor data and the parameters; determining an energy requirement for the vehicle and applying a charge return model based upon the charge parameters; and outputting the energy transfer profile.

In yet another aspect, the present invention provides a system for generating an energy transfer profile for modeling energy transfer for an application having a battery, the system comprises: memory for storing sensor data corresponding to energy consumption of the application over time; a user interface for receiving application parameters and one or more charge parameters; an energy transfer module having an input port for receiving the sensor data and the application parameters, the energy transfer module includes a component responsive to the sensor data and the application parameters for generating the energy transfer profile for the application, a component for determining an energy requirement for the application, and a component for applying a charge return model based on the charge parameters; and a component for outputting the energy transfer profile.

In a further aspect, the present invention provides a computer program product having a computer-readable medium tangibly embodying computer executable instructions for generating an energy transfer profile for modeling energy transfer for an application environment having a battery, the computer executable instructions comprise: computer executable instructions for receiving recorded sensor data for the application environment regarding energy consumption over time; computer executable instructions for receiving application environment parameters through a user interface, including one or more charge parameters; computer executable instructions for generating the energy transfer profile for the application environment based upon the sensor data and the application environment parameters, and including determining an energy requirement for the application environment and applying a charge return model based upon the charge parameters; and computer executable instructions for outputting the energy transfer profile.

In another aspect, the present invention provides a system for modelling energy transfer using an energy transfer profile for an application environment utilizing a battery as an energy source, the system comprises: means for receiving sensor data for the application environment, the sensor data being related to energy consumption; means for receiving one or more charge parameters for the battery; means for determining the energy transfer profile for the energy consumer based upon the sensor data, the energy profile determining means includes means for determining one or more energy needs for the application environment and means for applying a charge return model based upon the charge parameters; and means for outputting the energy transfer profile.

Other aspects and features of the present invention will be apparent to those of ordinary skill in the art from a review of the following detailed description when considered in conjunction with the drawings.

BRIEF DESCRIPTION OF THE DRAWINGS

Reference will now be made, by way of example, to the accompanying drawings which show embodiments of the present invention, and in which.

Similar references are used in different figures to denote similar components or features.

DESCRIPTION OF SPECIFIC EMBODIMENTS

Although embodiments of the present invention described below relate to modeling energy transfer for batteries used in the context of battery-powered vehicles in an industrial complex, the present invention is not so limited. The application environment being simulated may be any application environment, and need not be an industrial setting, and can include, for example, commercial, fleet, or residential applications. The present invention may be used to model or simulate an application environment for batteries and chargers in a variety of other contexts, as will be appreciated by those of ordinary skill in the art from the following description.

Figure 1:
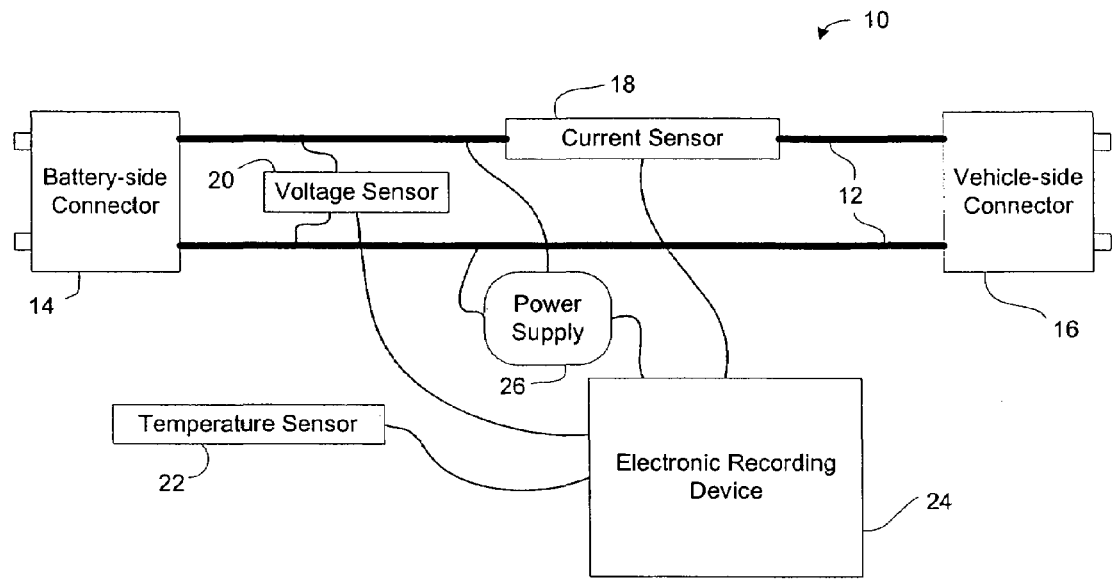
FIG. 1 shows in block diagram form a data recorder unit in accordance with present invention.

Reference is first made to FIG. 1, which shows a block diagram of a data recorder unit 10. The data recorder unit 10 includes power cables 12 that couple a battery-side connector 14 to a vehicle-side connector 16. The battery-side connector 14 is configured for attachment to a battery (not shown) and the vehicle-side connector 16 is configured for connection to the vehicle (not shown), such as an electric engine, thereby coupling the battery to the engine. The data recorder unit 10 collects data from the battery or battery pack and/or the vehicle as will be described in more detail below.

The data recorder unit 10 also includes sensors, such as a current sensor 18, a voltage sensor 20, and a temperature sensor 22. The current sensor 18 measures the current flowing in one or more of the power cables 12. The voltage sensor 20 measures the voltage drop across the power cables 12, and thus the battery terminals. The temperature sensor 22 measures the ambient temperature in the vicinity of the battery.

Each of the sensors 18, 20, 22, is also connected to an electronic data recording or collecting device 24. The electronic data recording device 24 receives signals from the sensors 18, 20, 22, and stores the received data in a memory. In one embodiment, the data recorder unit 10 includes a power supply 26 for powering the electronic recording device 24 using energy from the battery.

Figure 2:
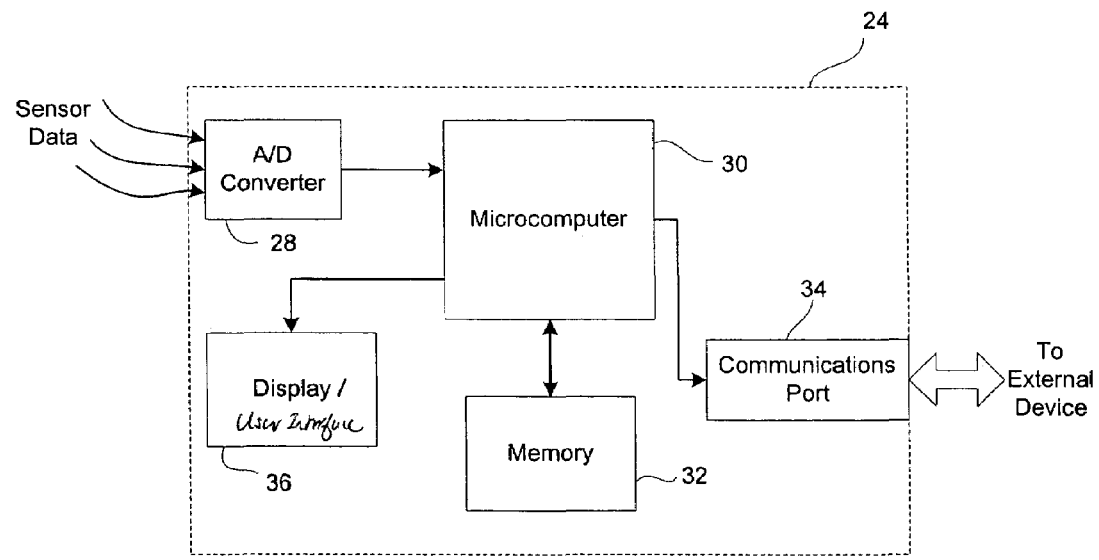
FIG. 2 shows a block diagram of an embodiment of an electronic recording device.

Reference is now made to FIG. 2, which shows a block diagram of an embodiment of the electronic recording device 24 of FIG. 1. In this embodiment, the sensors 18, 20, 22 (FIG. 1) provide analog signals to the electronic recording device 24. The electronic recording device 24 includes an analog-to-digital converter 28 for receiving the analog signals from the sensors 18, 20, 22 and converting them to digital signals. The analog-to-digital converter 28 outputs the digital signals to a microcomputer 30. The microcomputer 30 may comprise a microprocessor, microcontroller, or other programmable logic device. Under the control of a computer program, the microcomputer 30 stores the digital data in a memory 32. The microcomputer 30 is also suitably programmed to provide the functionality and computational operations as described in more detail below. The microcomputer 30 includes an internal clock.

The microcomputer 30 is connected to a communications port 34 for receiving external commands and data, and for outputting data and information in response to those commands and/or status requests. For example, the communications port 34 may include an RS-232 port for receiving serial communications from a remote computer or other external device, and for outputting stored data to a remote computer or other external device (not shown). In another embodiment, the communications port 34 may be coupled to a transceiver (not shown) to provide for wireless communications with a remote computer (not shown).

The data recorder unit 10 also includes a display 36 under control of the microcomputer 30. In one embodiment, the display 36 comprises a set of LED indicators. The LED indicators communicate status information regarding the data recorder unit 10 to a user. For example, the LED indicators may include a red, green and yellow LED, which are used to communicate status information having the meaning shown in the following table.

TABLE 1

| | | |
|---|---|---|
| Green | flashing once per second | normal operation |
| | on continuously | unit has power but is not operating |
| | off continuously | unit has no power |
| Yellow | on continuously | unit has detected current and is recording |
| | Flashing | unit is communicating with an external device |
| Red | on continuously | memory is full |
| | flashing once per 8 seconds | unit is disfunctional |

It will be understood that other arrangements of LED indicators may be used to communicate this status information or additional status information. Other types of displays or indicators may be used in place of LED indicators.

In operation, the data recorder unit 10 monitors the current flow into or out of the battery and the voltage across the battery terminals by way of the current sensor 18 and the voltage sensor 20, respectively. In one embodiment, when the data recorder unit 10 is initially connected to the battery and the vehicle, it generates a first record. The first record includes the time and the nominal battery voltage. Thereafter, the data recording unit 10 monitors the sensors to determine if the current exceeds a threshold, for example, 10 Amps. In one embodiment, the data recorder unit 10 monitors the sensors using a sampling rate of about 1 Hertz.

Once the current exceeds a threshold, the vehicle is assumed to be operating under real work conditions, as opposed to simply idling, and the data recorder unit 10 begins recording the sampled voltage and current data. The basis for the threshold is to conserve memory space during times when the charging or discharging currents are negligible in the analysis of energy transfer. It will be understood that, subject to memory limitations, the data recording unit 10 may be designed to record data without a triggering threshold or with a lower threshold.

When the data recorder unit 10 is triggered to record data by the current exceeding a threshold, it monitors the current and voltage over a time interval, for example, 15 minutes, and then creates and stores a record containing the data. The data may include the time, the voltage at the beginning and at the end of the interval, the current at the beginning and at the end of the interval, the maximum and minimum voltage over the interval, and the maximum and minimum current over the interval. Other information may be included within the record, for example, the charge delivered to the battery in the time interval or the discharge delivered by the battery over the time interval. These quantities are calculated by the microcomputer 30 based upon the current and voltage data sensed by the data recorder unit 10. For example, the calculation of discharge may be determined by integrating the current measurements over the interval in order to arrive at the Ampere-hours discharged. If the data recorder unit 10 includes the temperature sensor 22 (FIG. 1), then it may record the starting, ending, minimum, and maximum temperatures sensed over the interval. Examples of the types of fields that may be stored by the data recorder unit 10 in a record within the memory 32 are shown in the following table.

TABLE 2

| | |
|---|---|
| Cycle | record number (reset when memory cleared) |
| Start Time | time at start of fifteen minute interval |
| Charge | number of Ah delivered to the battery in interval |
| Discharge | number of Ah delivered by the battery in interval |
| Total Charge | number of Ah delivered to the battery since it was first connected |
| Total Discharge | number of Ah delivered by the battery since it was first connected |
| Start V | battery voltage at start of interval |
| End V | battery voltage at end of interval |
| Max V | maximum voltage during interval |
| Min V | minimum voltage during interval |
| Start I | current at start of interval |
| End I | current at end of interval |
| Max I | maximum current during interval |
| Min I | minimum current during interval |
| Start T | temperature at start of interval |
| End T | temperature at end of interval |
| Max T | maximum temperature during interval |
| Min T | minimum temperature during interval |

It will be appreciated that the functionality described above and below may be implemented as a combination of software and hardware elements. Components for providing the functions may comprise functions or routines implemented in code, or a computer program executed by the computing device 30, operating and controlling the hardware or interface elements comprising the system, or functions combined with hardware to provide the specified functionality.

Figure 3:
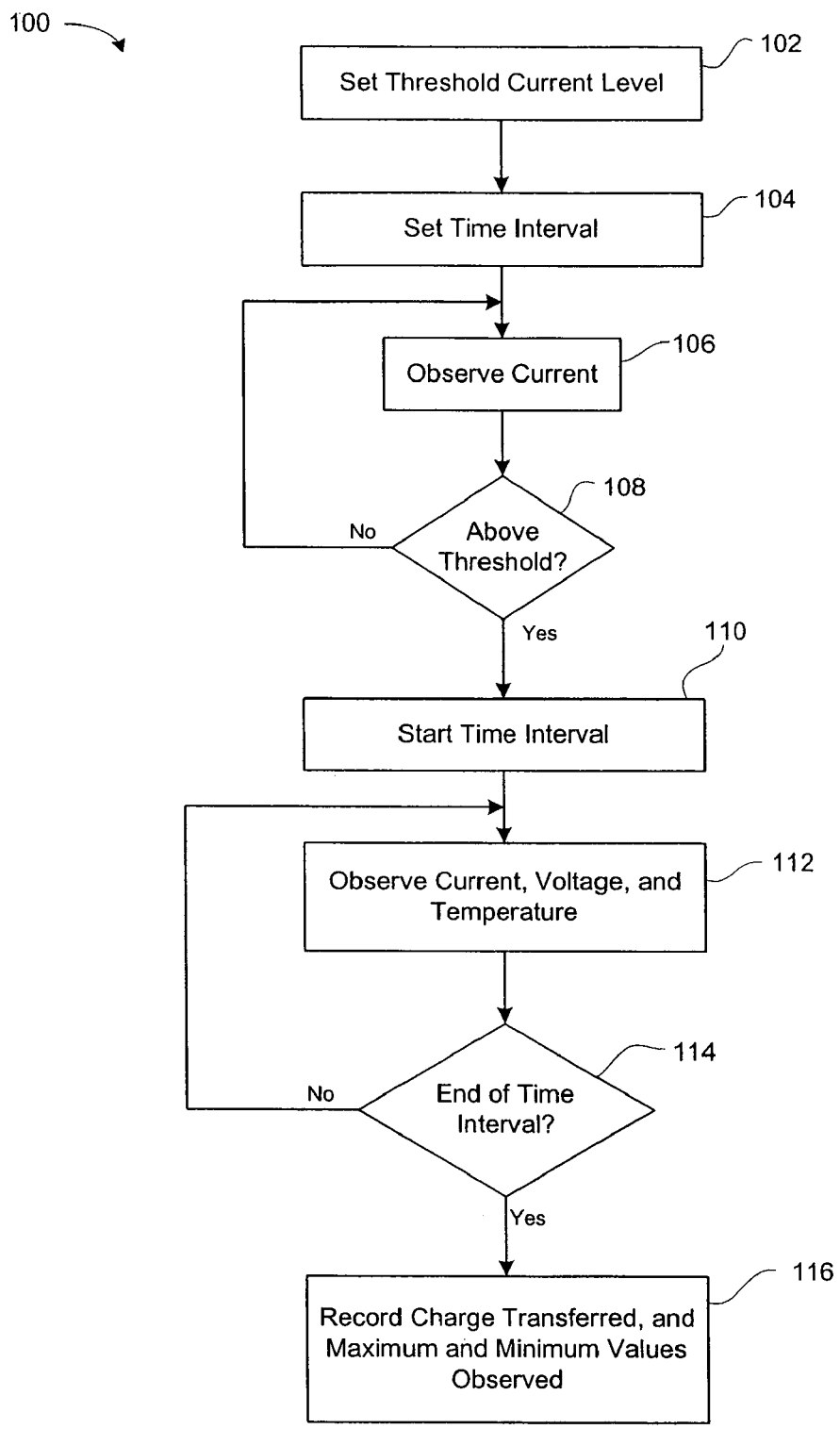
FIG. 3 shows in flowchart form a method of recording or collecting data according to one aspect of the invention.

Reference is now made to FIG. 3, which shows, in flowchart form, a method 100 of recording data in accordance with the present invention. The method 100 includes a first step 102 of setting a threshold current level required to trigger the beginning of a data acquisition cycle. Then, in step 104, the duration of the time interval is established. These steps 102 and 104 may include communicating these parameters to the microcomputer 30 (FIG. 2) from an external device by way of the communication port 34 (FIG. 2). The microcomputer 30 uses the parameters in the execution of computer code or a computer software program for implementing a data acquisition algorithm.

In steps 106 and 108, the data recorder unit 10 (FIG. 1) monitors the current using the current sensor 18 (FIG. 1). If the current exceeds the threshold, then the method 100 proceeds to step 110. At step 110, the time interval is started, and in step 112 the current, voltage, temperature, and any other sensors are monitored and the incoming analog data is observed and stored by the electronic recording device 24 (FIG. 1), as needed. When the time interval ends at step 114, the method 100 proceeds to step 116 and the electronic recording device 34 creates and stores a record, as described above.

An external device may be used to set parameters for data acquisition by the data recorder unit 10 (FIG. 1). The external device (not shown) may also be used to receive data acquired by the data recorder unit 10. The external device, for example, a suitably programmed personal computer, may then analyze the data in accordance with the present invention to develop an energy transfer profile. In some embodiments, the analysis may include data from multiple data recorder units 10 to produce an energy transfer profile or profiles accounting for the presence of multiple batteries (or battery packs) and/or multiple vehicles in an industrial operation. Accordingly, the analysis may profile an application environment involving more than one vehicle per charger.

Before analysis is performed on the downloaded or collected data, certain application environment parameters may be provided by a user through a user interface. For each vehicle the user may specify the battery size and type. The user may also specify the discharge current and any other battery-specific or vehicle-specific parameters for input. Other application environment parameters provided by the user may include charge parameters, such as an operating or charging schedule, ambient temperature and altitude (altitude affects air density/heat transfer). The operating schedule may indicate the times that the vehicle may be expected to be available for charging. Alternatively, the operating schedule may be obtained through an analysis of the recorded data, which reflects a time-based profile of the discharging and recharging of the battery under normal operating conditions.

According to other embodiments, the user may be given an opportunity to select a charging model. Given the energy needs that the application environment requires, as measured by the data recorder unit 10 (FIG. 1), various charging models are contemplated to meet those energy needs within the confines of a particular operating schedule. For example, the user may be prompted to select a charging model from a listing of traditional IVI charging, modified IVI charging, or Minit-Charger® rapid charging. The Minit-charger® rapid charging method is described in U.S. Pat. No. 6,495, 992, issued Dec. 17, 2002 and assigned to Edison Source, the common assignee of the subject application, the contents of which are incorporated herein by reference.

Figure 4:
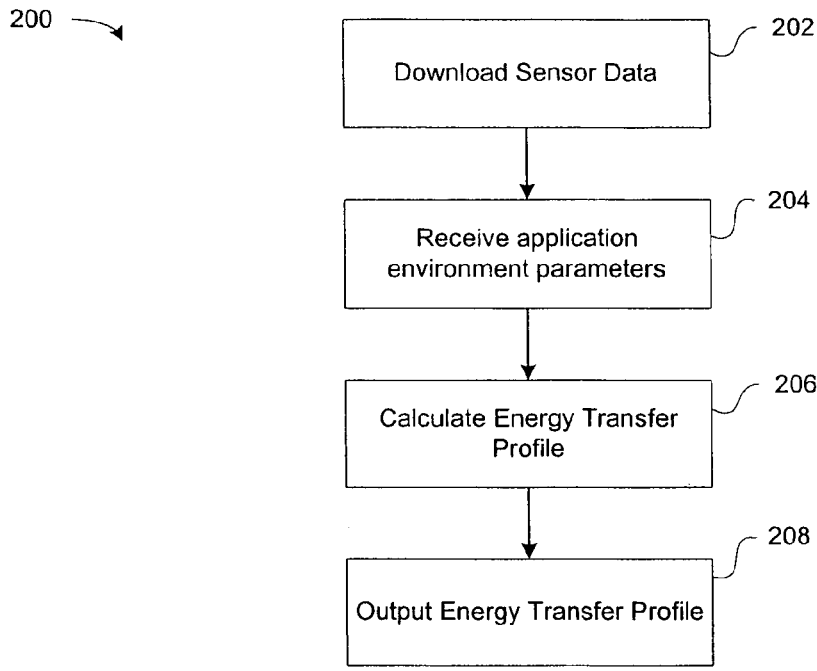
FIG. 4 shows in flowchart form a method for modeling energy transfer in a application environment.

Reference is next made to FIG. 4, which shows, in flowchart form, a method 200 for modeling energy transfer in a particular application environment, according to the present invention. The method 200 may be implemented using a suitably programmed personal computer or other computing device. The programming of the personal computer or other computing device to implement the functions and steps described herein is within the understanding of one of ordinary skill in the art.

As shown in FIG. 4, the method 200 begins in step 202 with the downloading or input of recorded or collected data from the data recording unit(s) 10 (FIG. 1). In step 204, the user supplies or inputs application environment parameters (for example using a user interface). The user-specified parameters may include battery parameters, an operating schedule, and/or a charging model.

Once the empirical data has been downloaded and the application parameters inputted, in step 206 an energy transfer profile is developed. The energy transfer profile is then outputted in step 208. The output may include displaying the energy transfer profile graphically on a screen or other output device, printing the energy transfer profile graphically using a printing device, or outputting the calculated data for the energy transfer profile to a printer or display. It may further include storing the calculated energy transfer profile data in a file or other record or data structure in memory.

The calculation of the energy transfer profile involves modeling the state of charge of the battery as a function of time. A number of factors comprise the model. First, the empirical data gathered by the data recording unit 10 (FIG. 1) provides information regarding the energy needs of the application environment as a function of time. Second, the application environment parameters provide constraints, such as the type of battery, size of battery, type of charger, and schedule for charging. These constraints impact both the effect of the energy needs upon the state of the battery and the extent to which the state of the battery can be restored through opportunity charging. The calculation of the energy transfer profile produces information about the state of the battery over time in the context of a particular application environment given the user-selected constraints. This allows a user to specify various battery types, chargers, or operating schedules in an attempt to find a combination of constraints that result in a successful model. Using this approach, the user can determine the appropriate battery and/or charger for use in the particular application environment.

Figure 5:
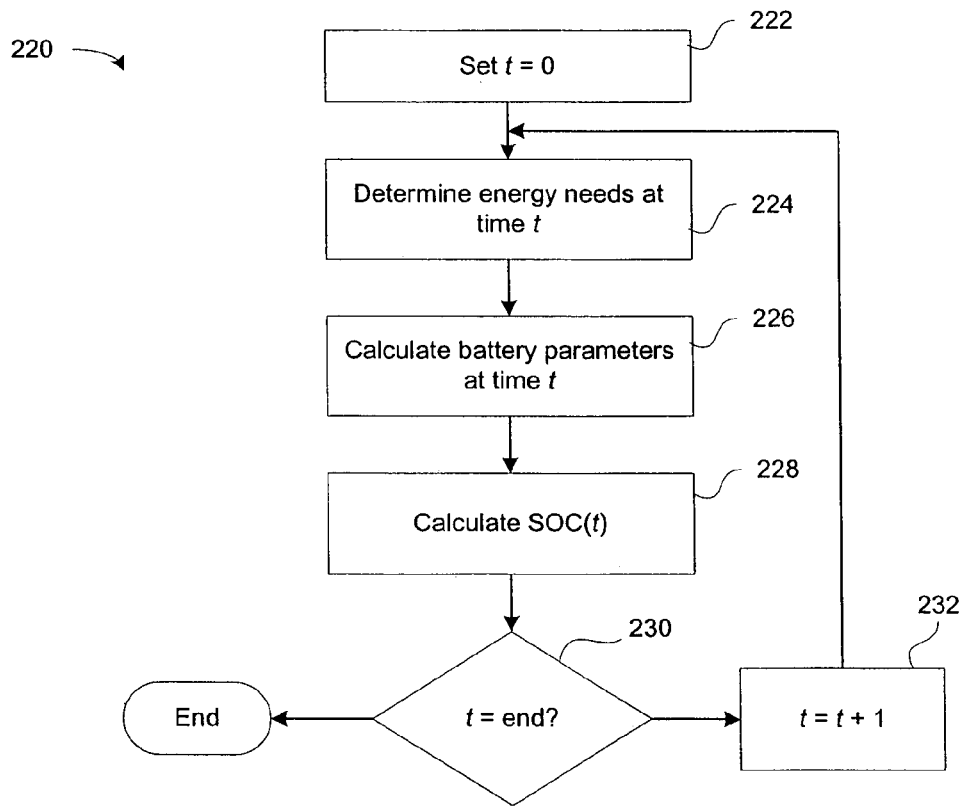
FIG. 5 shows in flowchart form a method of calculating an energy transfer profile.

Reference is next made to FIG. 5, which shows, in flowchart form, a method 220 of calculating an energy transfer profile, as contemplated in step 206 of the method 200 in FIG. 4.

The method 220 begins with the initialization of a time or count value in step 222. The time value may be initialized to a zero value, or it may be set to a particular time value based upon the time at which the data recording unit 10 began gathering data. Next, in step 224, the energy needs of the application environment corresponding to the time value are determined. The energy needs are determined from the sensor data. There are a number of ways in which the energy needs of the application environment for a particular time value or, more particularly, for a time interval $\Delta t$, beginning at the current time value, may be determined from the sensor data. According to one aspect, the recorded sensor data regarding the discharge pattern of the application environment is used to calculate an average discharge rate for the application environment. This average rate may be used to determine the discharge over the time interval $\Delta t$.

According to another aspect, the discharge occurring in the time interval $\Delta t$ is taken directly from the discharge measured in the corresponding time interval when the sensor data was recorded. Accordingly, the relevant sensor data for the time value t includes the data corresponding to the time value, such as the battery voltage data at time t, the current data at time t, the ambient temperature at time t, the measured discharge or charge delivered or received by the battery over a measurement interval beginning at time t, and any other relevant data that may have been gathered to reflect the state of the battery/vehicle at time t and over the time interval $\Delta t$. Other methods of modeling the discharge based upon the recorded sensor data may be employed.

In step 226, various battery parameters are calculated for the time value t. The battery parameters calculated may include the battery temperature and the internal resistance of the battery. These parameters vary over time and impact each other and may also relate to the extent to which the battery's state is affected by charging or discharging. The parameters are particularly relevant to modeling the extent to which the battery's state may be restored through recharging using the selected charging model. Changes in internal resistance and/or temperature affect the rate at which recharging of the battery occurs and the effect that a particular charge current has on the state of the battery. Recorded sensor data, such as the ambient temperature measured at time t and the voltage and the current readings for time t and over the interval $\Delta t$, may be used in step 226 to calculate the battery parameters. The calculation of the battery parameters is also dependent upon some of the application parameters input by the user, such as the battery type and capacity.

The battery temperature may be determined by applying a net heat energy balance to a start ambient temperature. The battery temperature at any particular time is affected by accumulated heat that results from the excess of heat generated as compared to heat dissipated. Heat is generated within the battery as a result of the internal resistive heat losses, i.e. the $I^2R_{in}$ losses, during both charge and discharge, which are directly dependent upon the internal resistance of the battery. The heat dissipation depends upon convection and/or radiation of heat from the external surface to the surrounding air. The calculation of heat dissipation also depends upon the type of battery, as the calculation is different for conventional batteries versus air-gapped batteries, as will be described in more detail below.

Once the effects of charge and discharge and the related quantities on various battery parameters are calculated for the battery at time t, then in step 228 the state of charge (SOC) of the battery at time t is determined. The state of charge SOC depends, in part, upon the state of charge at time t-1, the discharge delivered by the battery over the intervening time period $\Delta t$, and the calculated charge returned to the battery under the selected charge return model over the intervening time period $\Delta t$. Whether the battery is discharging or charging at time t may be determined from the charge schedule. If the battery is discharging, then the magnitude of the discharge is taken from the determination made in step 224. The quantity of charge delivered by the charger to the battery if the battery is being charged may be determined using the charge return model. The charge return models may take into account various factors, including battery temperature, internal resistance, battery terminal voltage, and battery SOC.

After the state of charge SOC of the battery at time t is determined, it is stored in memory and in step 230 an evaluation is made as to whether the calculation of the energy transfer profile is complete. If not, then in step 232 the time value is incremented by an applicable quantity. According to one aspect, the time value is increased in one minute increments, i.e. $\Delta t$ is one minute. The size of the time increments in the modeling of energy transfer need not be the same as the size of the time intervals used in recording sensor data. The method 220 then returns to step 224 to continue to build the energy transfer profile.

It will be understood that as the method 220 incrementally steps through time to produce the state of charge data for the battery, the measured quantities for voltage and other parameters may be adjusted based upon modeled activity, such as the charge returned to the battery under the selected charge return model and the specified operating schedule.

As described above, the internal battery temperature is continuously re-calculated with each increment of time to model the temperature fluctuations within the battery. Heat is generated within the battery as a result of the internal resistance of the battery, which is itself changes with time, partly in response to changes in the battery temperature. The temperature change in a battery that is being charged has a dual origin: Joule effect, and reversible thermodynamic heat effect. The Joule effect represents heat effects that are caused by current flow through the conductive elements of the battery, for example, posts, plates, electrolyte, intercell connectors. The reversible thermodynamic heat effect is caused by the difference between the enthalpy and the Gibbs free energy of the chemical reactions taking place during the charge/discharge process. While thermodynamic heat effects can be significant in some battery technologies, for example, nickel metal-hydride, in a lead-acid battery, the thermodynamic heat effects are small. Therefore, for most determinations, the Joule effect outweighs the reversible thermodynamic effect on the rate of charge or discharge.

A conventional battery having no air gaps between cells will dissipate heat based upon surface to air heat transfer through natural convection and radiation. The dissipation of heat is modeled using a calculated coefficient for surface to air heat transfer.

In an air-gapped battery, heat is removed through the external battery walls, and also by convection within designated parallel-plate channels inside the battery. Heat transfer coefficients for these channels are influenced by the channel geometry, such as the distance between the plates, and the length and height of the plates. Net radiation heat flux between parallel plates is zero, as they are isothermal.

Convective heat transfer coefficients for both battery types, i.e. conventional and air-gapped, are repeatedly calculated with each increment of time to reflect the ambient air parameters, such as temperature, humidity and density (i.e. application site altitude), and the fluctuation in battery parameters, such as internal temperature, that influence the physical properties of air near the surface of the battery.

Natural convection is the motion that results from the interaction of gravity with density differences within a fluid. The natural convection is another parameter which is taken into account according to this aspect of the invention. The intensity of this motion may be determined using dimensionless groups that arise in the non-dimensionalized equations of motion and their boundary conditions. The dimensionless groups include Rayleigh and Prandtl numbers, which govern the relative importance of viscous and inertial forces within a fluid.

For a given geometry, a Nusselt number can be calculated as a function of the Rayleigh (Ra) and Prandtl (Pr) numbers, as shown by the following equation:

$$Nu = f(Ra, Pr) \qquad \text{Eq. 1}$$

With a known Nusselt number, the heat transfer coefficient ($\alpha$) is determined using the equation:

$$\alpha = Nu \Lambda / L \qquad \text{Eq. 2}$$

where $\Lambda$ represents the thermal conductivity of air at a temperature T, and L represents a characteristic length related to the surface. In the case of a vertical plate, the L quantity may be the height of the plate, whereas in the case of a calculation of the heat transfer coefficient for the gap between parallel plates, the quantity L may be the distance between the plates.

The Prandtl number is calculated using the following equation:

$$Pr = Cp\mu/\Lambda \qquad \text{Eq. 3}$$

where Cp is the heat capacity of air at a constant pressure, and $\mu$ is the dynamic viscosity or air at a temperature T.

For a conventional battery layout, the following equations are used:

$$Ra = g\beta \Delta T L^3 / (\nu a) \qquad \text{Eq. 4}$$

$$Cl = 0.671/(1+(0.492/Pr)^{9/16})^{4/9} \qquad \text{Eq. 5}$$

$$Ctv = 0.13 Pr^{0.22}/(1+0.61 Pr^{0.81})^{0.42} \qquad \text{Eq. 6}$$

where g is the acceleration of gravity, $\beta$ is the thermal expansion coefficient of air, v is the kinematic viscosity of air at temperature T, a is the thermal diffusivity of air at temperature T, and Cl and Ctv are empirical constants functionally related to the Prandtl number Pr.

There are different variations of the Nusselt number Nu depending on the characteristics of the situation and the intensity of the convection. For example, there is a thin film Nusselt number $Nu_T$, which is determined using the following equation:

$$Nu_T = Cl Ra^{1/4} \qquad \text{Eq. 7}$$

There is also a laminar Nusselt number $Nu_L$, which may be determined using the following equation:

$$Nu_L = 2/[\ln(1+2/Nu_T)] \qquad \text{Eq. 8}$$

Finally, there is a turbulent Nusselt number $Nu_{TU}$, which is determined using the following equation:

$$Nu_{TU} = Ctv Ra^{1/3}/(1+1.4E9 Pr/Ra) \qquad \text{Eq. 9}$$

In one embodiment, an overall Nusselt number Nu is determined as a combination of two or more of the specific Nusselt numbers, such as in the following equation:

$$Nu = [(Nu_L)^m + (Nu_T)^m]^{1/m} \qquad \text{Eq. 10}$$

where, according to one embodiment, the variable m has a value of 6.

The amount of heat dissipated by radiation may be determined as follows:

$$Q_{1-2} = A_{1-2} * \sigma * (e_b T_b^4 - e_o T_o^4) \qquad \text{Eq. 11}$$

where:

$Q_{1-2}$ is the dissipated heat [W];

$A_{1-2}$ is the surface area of the battery available for radiative heat dissipation (area facing the truck compartment should not be counted as the net radiative heat exchange will be negligible);
σ is the Stefan-Boltzman constant, 5.67 E-8[W/(m2 K4)];
$e_b$ is the emissivity of the battery surface [1];
$e_o$ is the emissivity of air [1];
$T_b$ is the absolute battery temperature [K]; and
$T_o$ is the absolute ambient temperature [K].

When dealing with an air-gapped battery, the following equation is used to calculate the Raleigh number Ra for heat transfer through the air gap:

$$Ra = g\beta \Delta T L^4 / (vaH) \qquad \text{Eq. 12}$$

where L is the gap size and H is the height of the battery.

The Nusselt number Nu for the air gap in the case of an air-gapped battery is calculated using the following equation:

$$Nu = [(Ra/24)^m + (1.3 C l Ra^{1/4})^m]^{1/m} \qquad \text{Eq. 13}$$

where, according to one embodiment, the variable m has a value of −1.9.

To simplify the calculations detailed above, in one embodiment the following rationalizations and assumptions are made. First, it is assumed that all batteries are at 100 percent state of charge SOC and at ambient temperature at the beginning of the modeling. Second, the calculated battery temperature represents surface temperature, so that no thermal gradients exist inside the battery. Third, heat energy transport (conduction and convection) inside the battery is not an overall energy rate-limiting factor and may be omitted from the calculation. Fourth, the battery abuse by users that may typically be observed does not result in performance degradations that impact charge acceptance ability, capacity, internal resistance, or other battery characteristics. Other embodiments may make additional simplifying assumptions. Still other embodiments may reject some or all of the foregoing assumptions and take these factors into account in the calculations.

Figure 6:
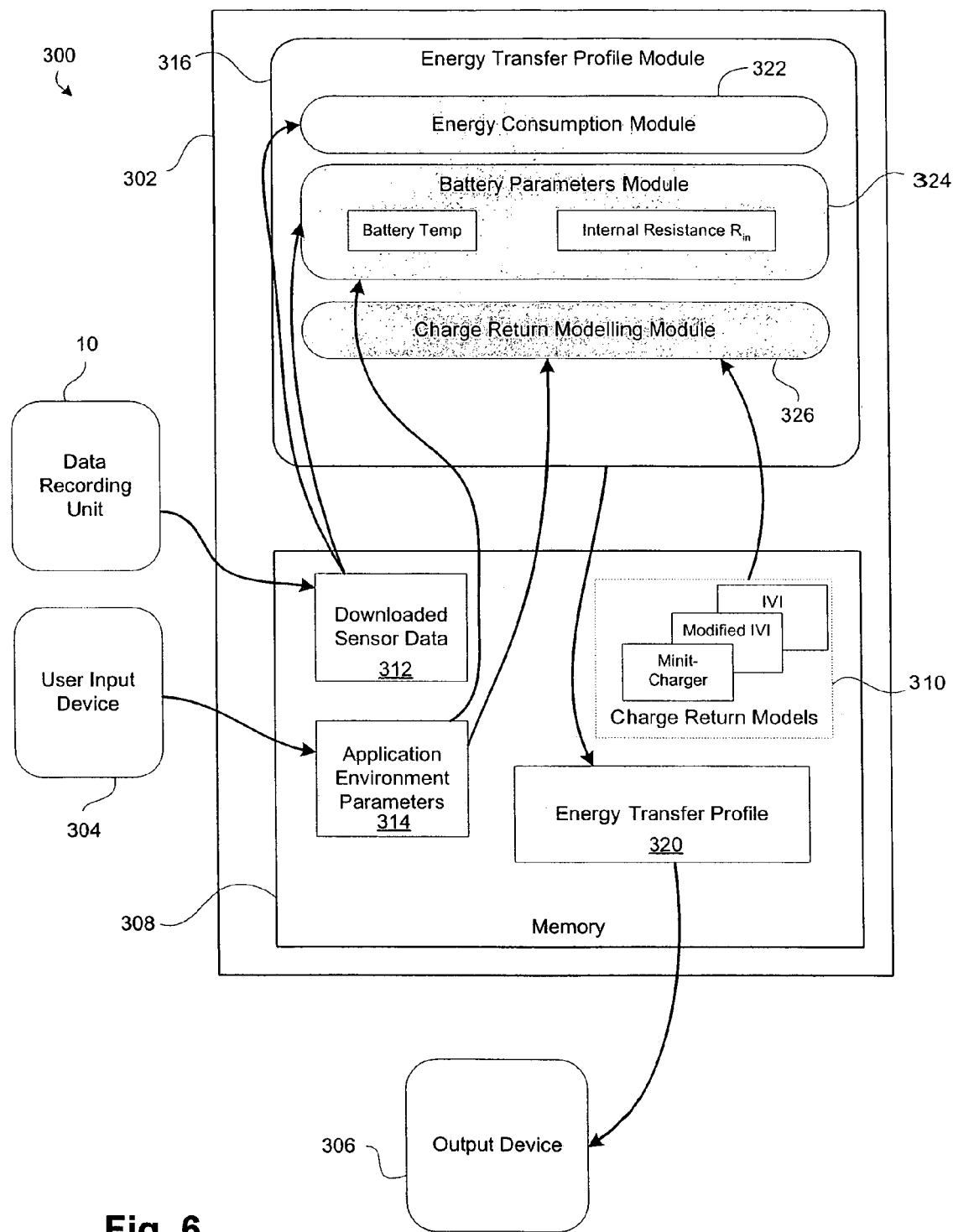
FIG. 6 shows a block diagram of a system for modeling energy transfer in a battery for a application environment.

Reference is next made to FIG. 6, which shows a block diagram of a system 300 for modeling energy transfer for a battery in an application environment, according to the present invention. The system 300 includes the data recording unit 10, a computer 302, an input device 304 coupled to the computer 302, and an output device 306 coupled to the computer 302. The computer 302 comprises any data processing device, for example, a microprocessor or microcontroller-based devices, having the capacity to execute computer code or a software program for collecting data, applying algorithms to manipulate data, and outputting data. The input device 304 includes peripheral devices that permit a user to input data or select data, for example, a keyboard, mouse, trackpad, or other input device. The output device 306 includes devices that output data to the user, for example, a display screen, printer, or storage medium, such as a disk, memory card or other portable storage device. The output device 306 may also include internal or external memory to which data may be written.

The computer 302 includes a memory 308. The memory 308 comprises random-access memory or RAM, a floppy disk, a hard disk, flash memory, or other mediums or mass storage devices for storing data for use by a computer 302.

The memory 308 stores data including charge return models 310, sensor data 312, and application environment parameters 314. The sensor data 312 is obtained, e.g. downloaded, from the data recording unit 10. The application environment parameters 314 are inputted from the user through a user interface, via the input device 304.

The computer 302 executes computer code for an energy transfer profile module 316. The energy transfer profile module 316 receives data from the memory 308 and, in particular, sensor data 312, application environment parameters 314, and/or one of the charge return models 310. The energy transfer profile module 316 calculates and outputs energy transfer profile data 320, which in turn may be output from the computer 302 via the output device 306.

The energy transfer profile module 316 includes an energy consumption module 322, a battery parameters module 324, and a charge return modeling module 326. The energy consumption module 322 determines the energy needs of the application environment based upon the sensor data 312, as discussed above in connection with FIG. 5. The battery parameters module 324 models changes in various battery parameters over time, including battery temperature and internal resistance, as the battery is charged or discharged, as discussed above in connection with FIG. 5. The battery parameters module receives sensor data 312 and application environment parameters 314. The charge return modeling module 326 receives application environment parameters 314, including a charge or operating schedule, and a selected charge return model 310. The charge return modeling module 316 determines the quantity of charge returned to the battery over time based upon the charge schedule and the charge return model 310, as described above in connection with FIG. 5.

Reference is now made to FIGS. 7 through 10, which show in graphical form, exemplary energy transfer profiles generated in accordance with the present invention.

Figure 7:
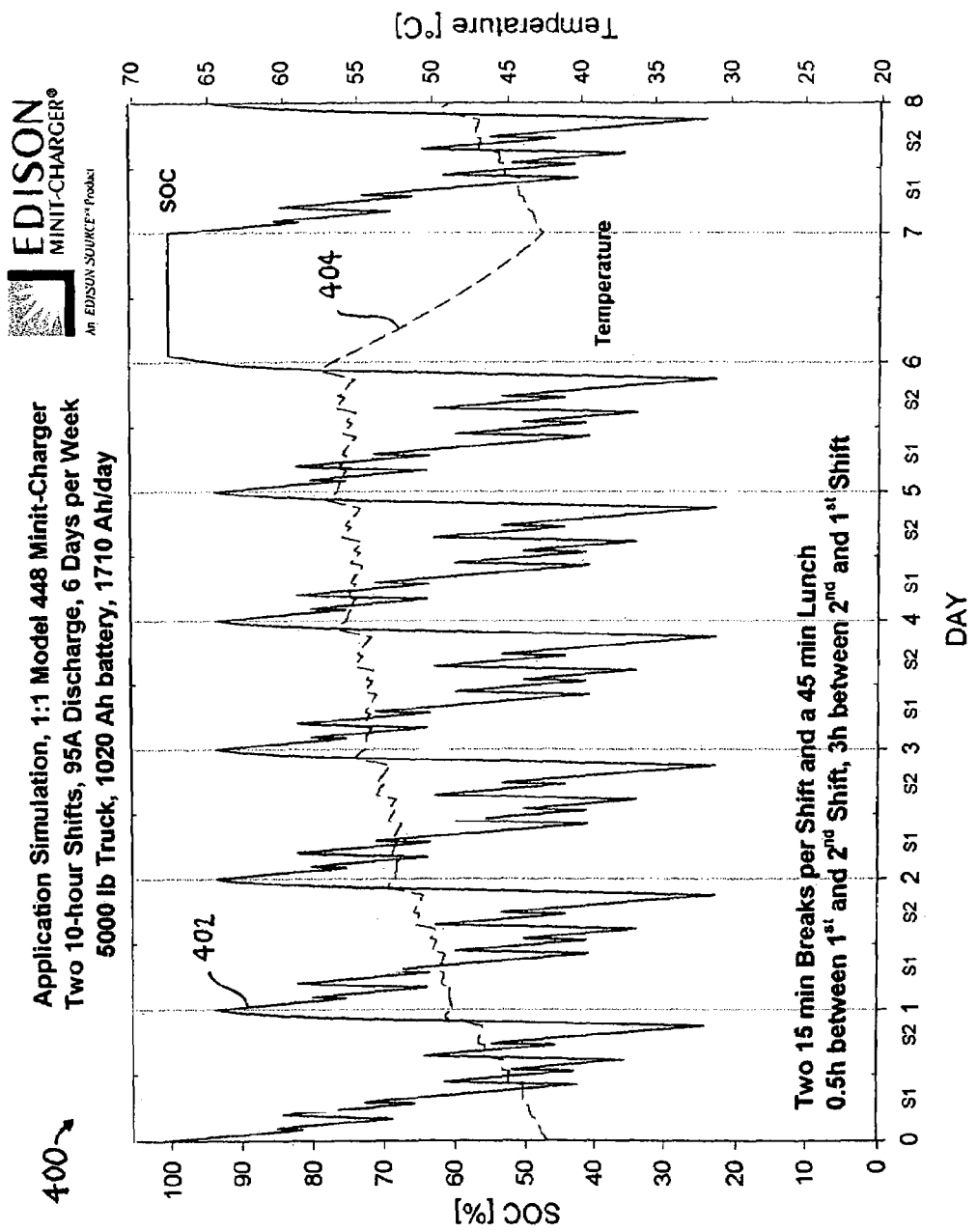
FIGS. 7 to 10 show exemplary graphs of energy transfer profiles produced in accordance with the present invention.

FIG. 7 shows a graph 400 of a state of charge 402 of a battery over time and the corresponding battery temperature 404 over time. The graph 400 reflects a simulation run based upon a 1-to-1 battery to charger situation, with the battery being a 1020 Ah capacity battery powering a 5000 lb truck. The truck is used six days a week in two ten-hour shifts per day. Each shift includes two fifteen minute breaks and one forty-five minute lunch break. A half-hour break is assumed between the first and second shift, and a three-hour break is assumed between the second shift and the first shift of the next day. The charger is a Model 448 Minit-Charger® controlled-feedback rapid battery charger.

In accordance with the present invention, the state of the charge 404 of the battery is determined as a function of time based upon the iterative time-based calculation of energy consumed in operating the truck and the energy returned through recharging during breaks or other opportunity charge periods. As may be seen from the graph 400, the proposed charging scenario is workable, since the battery state of charge remains above 20 percent at all times. The battery temperature 404 starts from an ambient temperature of about 43 degrees Celsius and peaks at about 57 degrees Celsius.

Figure 8:
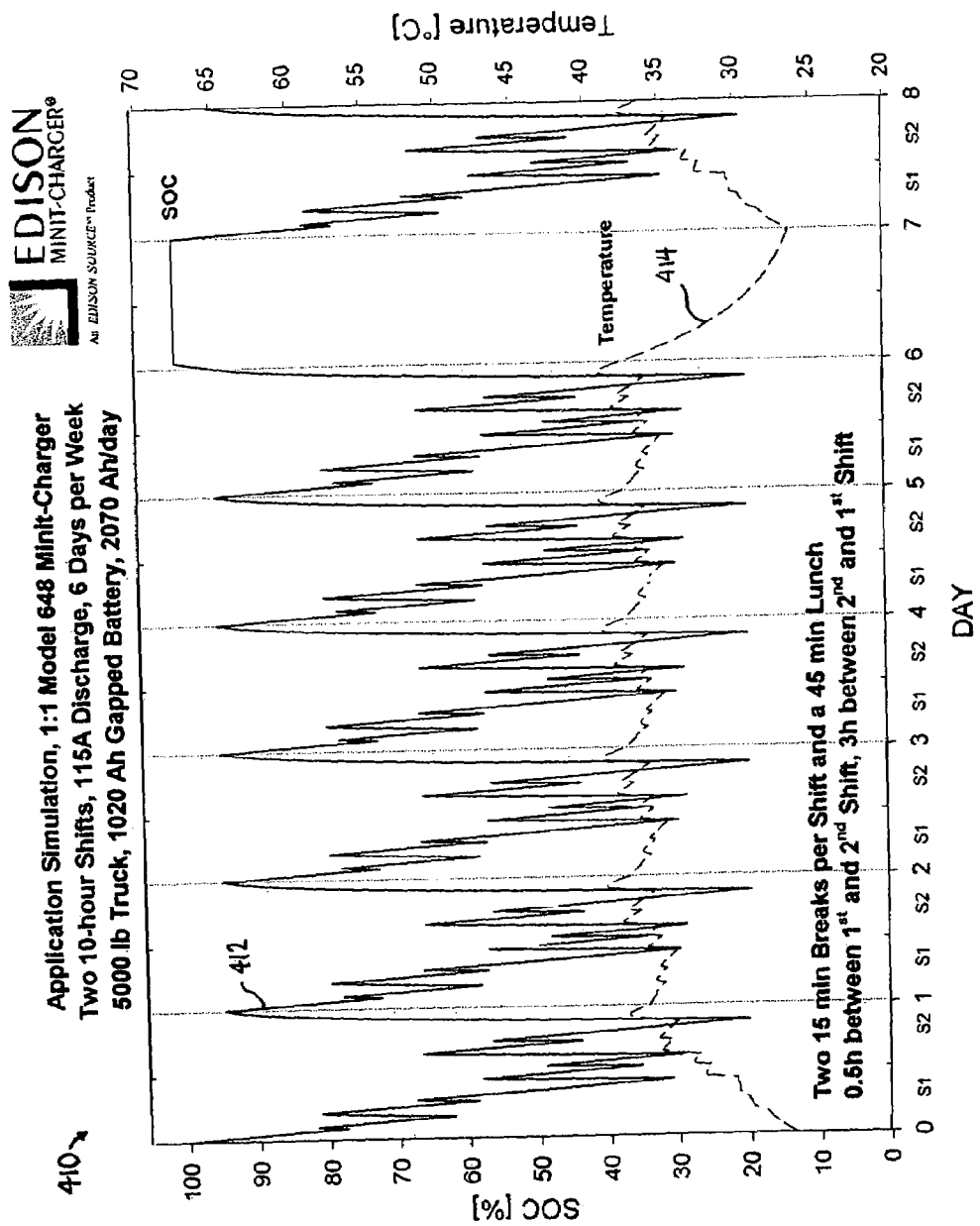

FIG. 8 shows another graph 410 of a state of charge 412 over time and a battery temperature 414 over time, using similar parameters, but with an air-gapped battery and with a Model 648 Minit-Charger® controlled-feedback rapid battery charger. Again, it is observed that the proposed charging solution maintains the state of charge 412 within an acceptable range during operation. The battery temperature 414 starts from an ambient temperature of about 26 degrees Celsius and peaks at about 39 degrees Celsius.

Figure 9:
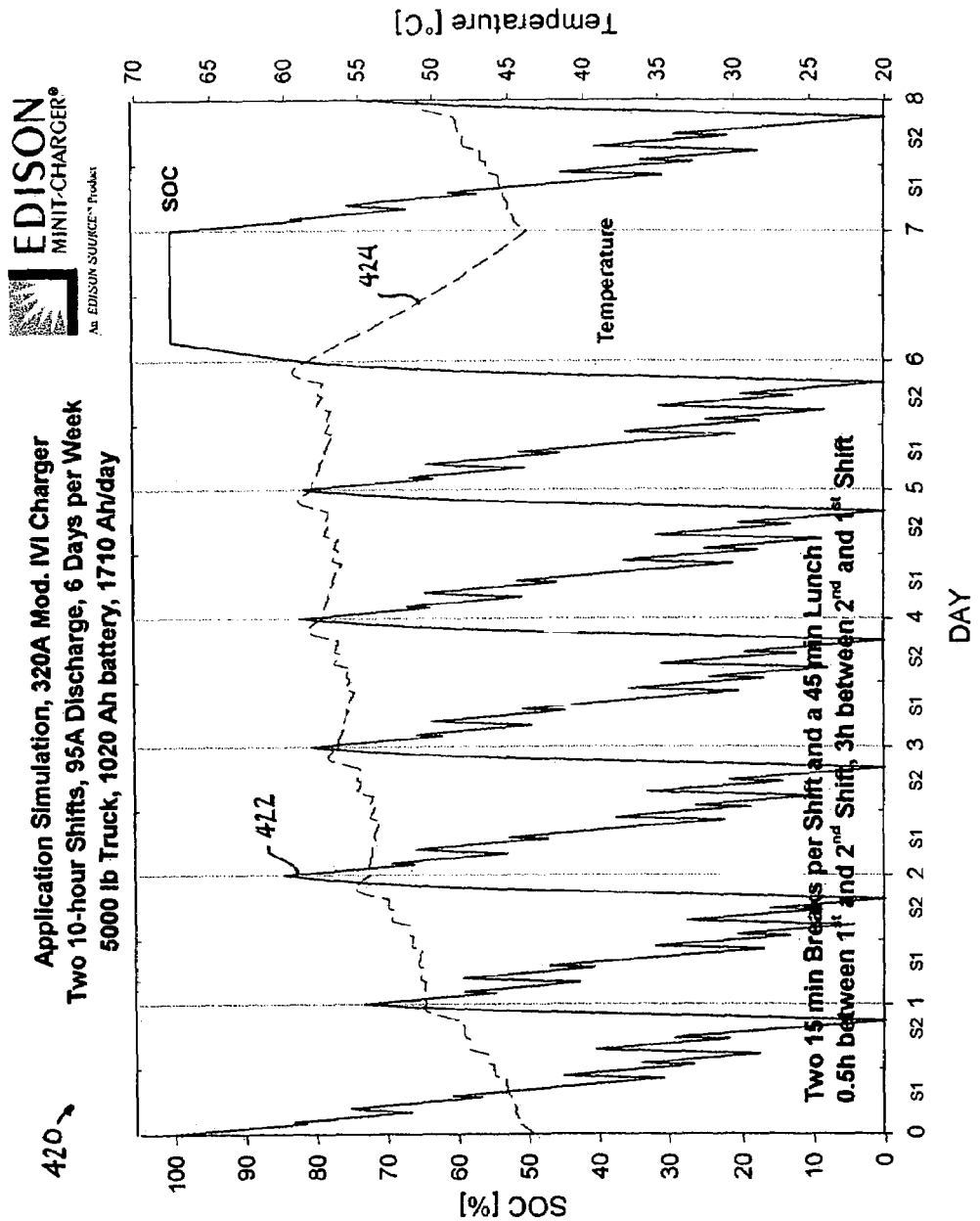

Another example is shown in FIG. 9, which shows a graph 420 of a state of charge 422 and a battery temperature 424 over time in the case of a charging model based upon a 320A Modified IVI charger. In this case, it will be appreciated that graph 420 of the simulation demonstrates that the proposed charging solution fails to work, since the state of charge 422 drops to zero in the course of operation.

Figure 10:
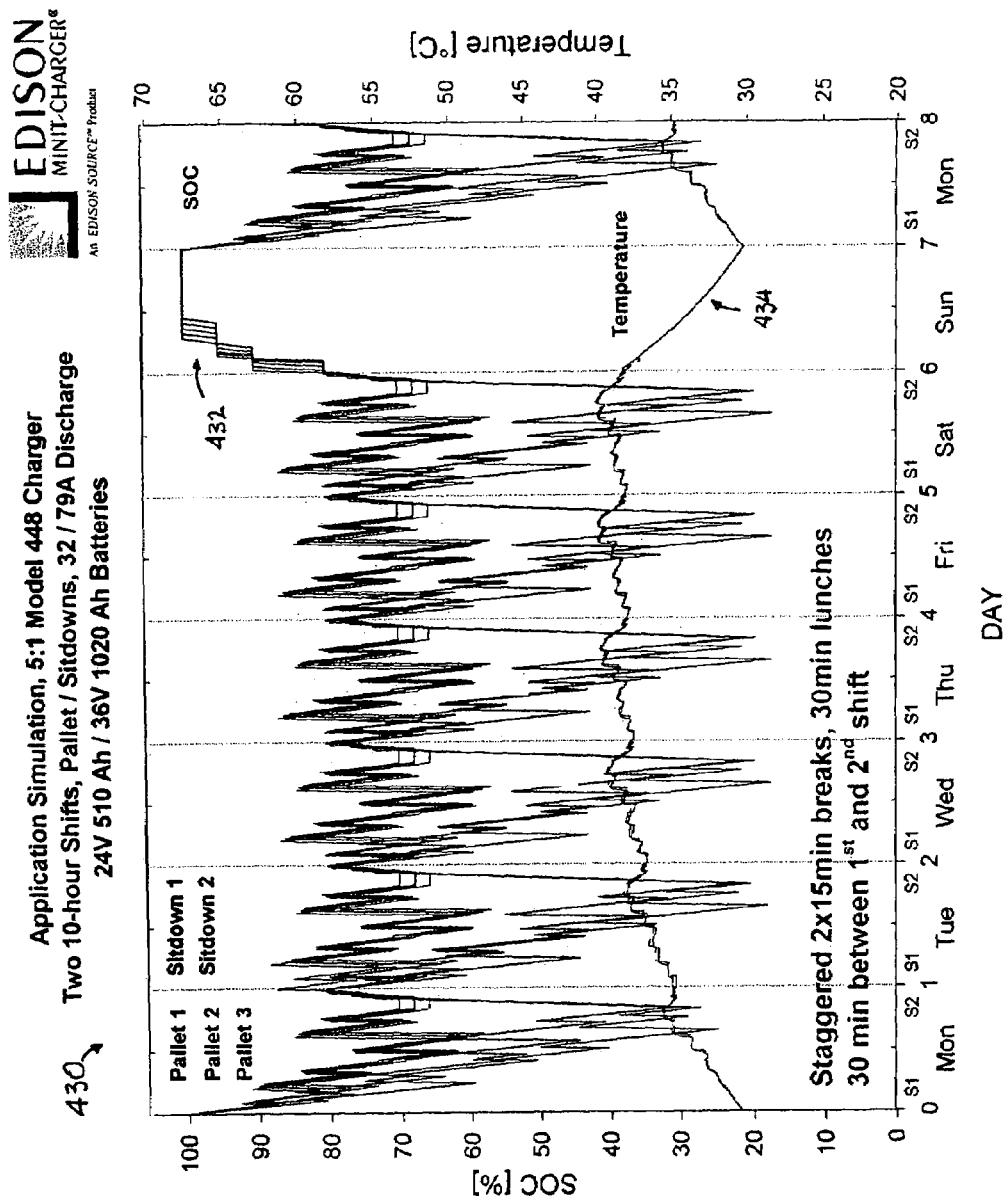

FIG. 10 shows a graph 430 of five states of charge 432 and five battery temperatures 434. This example illustrates a simulation involving one charger and five vehicles. Three of the vehicles are pallet jacks and two are sitdowns. The pallet jacks utilize 24 Volt 510 Ah capacity batteries and the sitdowns utilize 36 Volt 1020 Ah capacity batteries. The charge return model is based upon a Model 448 Minit-Charger® controlled-feedback rapid battery charger. The charge schedule contemplates staggered breaks and thirty minute lunches.

The five states of charge 432 shown in the graph 430 illustrate that the contemplated use of one charger with five batteries in the circumstances of the example is sufficient to maintain all five batteries at an acceptable state of charge under operating conditions.

It will be understood that some embodiments of the present invention may integrate the collection of data and the simulation analysis into a single processing unit onboard a vehicle under test. In such an embodiment, the data recording unit 10 (FIG. 1) need not download the recorded sensor data to an external device or computer, since the input of application environment parameters and the calculation of the energy transfer profile is associated with an integrated data recorder unit and energy transfer modeling system.

It will be appreciated that the embodiments of the present invention may be implemented by a computer program product having a computer-readable medium tangibly embodying computer executable instructions for directing a data processing system to implement the embodiments of the invention. Also, the computer program product may be used to configure a processing system which embodies the invention. It will be appreciated that the computer program product may be a floppy disk, hard disk or other medium for long term storage of the computer executable instructions.

It will be appreciated that the embodiments of the present invention may be realized by conveying an article over a network from a supplier to an end user, in which the article has a computer-readable signal-bearing medium, and also has means in the medium for directing a data processing system to implement embodiments of the invention. It will be appreciated that a supplier of the method may upload the article to a network, such as the Internet, and users may download the article via the network to their respective data systems.

The present invention may be embodied in other specific forms without departing from the spirit or essential characteristics thereof. Certain adaptations and modifications of the invention will be obvious to those skilled in the art. Therefore, the above discussed embodiments are considered to be illustrative and not restrictive, the scope of the invention being indicated by the appended claims rather than the foregoing description, and all changes which come within the meaning and range of equivalency of the claims are therefore intended to be embraced therein.

What is claimed is:

1. A method of modelling energy transfer a cyclical application environment utilizing a battery as an energy source, said method comprising the steps of:
   a) receiving sensor data for the application environment, said sensor data being related to energy consumption of a cycle of the application environment;
   b) receiving one or more charge parameters for the battery including a charge schedule, the charge schedule defining times and time intervals during which the battery is available for charging;
   c) generating an energy transfer profile modeling the battery state of charge over time in future cycles of the application environment based upon the received sensor data and the received charge parameters, said step including determining one or more energy needs for the application environment and applying a charge return model based upon said charge parameters; and
   making available the energy transfer profile;
   wherein the charge return model is constrained by the charge schedule.

2. The method as claimed in claim 1, further including the step of receiving one or more application environment parameters for said step of generating the energy transfer profile.

3. The method as claimed in claim 1, wherein said step of generating the energy needs of the application environment includes obtaining a discharge value for the battery from said sensor data.

4. The method as claimed in claim 2, wherein said step of generating the energy transfer profile includes incrementally calculating battery parameters and a battery state of charge over time based upon said energy needs and said charge return model.

5. The method as claimed in claim 4, wherein said step of calculating said battery state of charge over time includes incrementally calculating a charge returned to the battery as a result of said charge return model.

6. The method as claimed in claim 4, wherein said battery parameters include a battery internal resistance and a battery temperature.

7. The method as claimed in claim 6, wherein said step of calculating battery parameters includes determining a change in said battery temperature based upon a difference between heat generated and heat dissipated.

8. The method as claimed in claim 7, wherein said heat generated is calculated as a product of said battery internal resistance and a battery current product.

9. The method as claimed in claim 8, further including a step of determining said heat dissipated based on a calculation of surface-to-air convection from an external surface of the battery.

10. The method as claimed in claim 9, wherein the battery comprises an air-gapped battery, and wherein said step of determining said heat dissipated includes a calculation of heat dissipated through parallel-plate convection within said air-gapped battery.

11. The method as claimed in claim 4, wherein said charge return model is selected from a group including IVI, modified IVI, and controlled-feedback rapid charging.

12. The method as claimed in claim 1, wherein said sensor data includes voltage and current measurements taken over time for the battery.

13. The method as claimed in claim 12, further including the step of recording said sensor data with a data recording unit coupled to the battery while operating in the application environment.

14. The method as claimed in claim 13, wherein said recorded sensor data includes temperature measurements.

15. The method as claimed in claim 14, wherein said recorded sensor data includes discharge measurements taken over a time interval.

16. A method for generating an energy transfer profile modelling energy transfer in a vehicle utilizing a battery as an energy source in a cyclical application environment, said method comprising the steps of:
- a) receiving recorded sensor data for the vehicle relating to energy consumption over time for a cycle of the application environment;
- b) receiving a plurality of parameters including one or more charge parameters including a charge schedule through a user input interface, the charge schedule defining times and time intervals during which the battery is available for charging;
- c) determining an energy requirement for the vehicle and applying a charge return model based upon said charge parameters;
- d) generating the energy transfer profile for the vehicle modeling the battery state of charge over time in future cycles of the application environment based upon said recorded sensor data and said parameters and
- e) outputting the energy transfer profile.

17. The method as claimed in claim 16, wherein said step of determining the energy requirement for the vehicle comprises obtaining a discharge value for the battery from said recorded sensor data.

18. The method as claimed in claim 17, wherein said step of generating the energy transfer profile comprises incrementally calculating battery parameters and calculating a battery state of charge based on said energy requirement and said charge return model.

19. The method as claimed in claim 18, wherein said step of calculating said battery state of charge includes incrementally calculating a charge returned to the battery based on said charge return model subject to said charge schedule.

20. A system for generating an energy transfer profile for modelling energy transfer for a cyclical application having a battery, said system comprising:
- a) a memory for storing sensor data corresponding to energy consumption during a cycle of the application;
- b) a user input interface for receiving application parameters and one or more charge parameters including a charge schedule, the charge schedule defining times and time intervals during which the battery is available for charging;
- c) an energy transfer module having an input port for receiving said sensor data and said application parameters, said energy transfer module including a component responsive to said sensor data and said application parameters for generating the energy transfer profile modeling the battery state of charge over time in future cycles of the application, and a component for applying a charge return model based on said charge parameters; and
- d) a component for outputting the energy transfer profile;
- wherein the charge return model is constrained by the charge schedule.

21. The system as claimed in claim 20, further including a component for determining an energy requirement, said component being responsive to a discharge rate for the battery, said discharge being determined from said sensor data.

22. The system as claimed in claim 21, wherein said energy transfer module includes a component for calculating battery parameters and a component for calculating a battery state of charge over time based upon said energy requirement and said charge return model.

23. The system as claimed in claim 22, wherein said energy transfer module includes a component for incrementally calculating a charge returned to the battery based on said charge return model.

24. The system as claimed in claim 23, wherein said charge return model is selected from a group including IVI, modified IVI, and controlled-feedback rapid charging.

25. The system as claimed in claim 24, further including a data recorder unit having inputs for inputting said sensor data from the battery while operating in the application.

26. The system as claimed in claim 25, wherein said sensor data includes discharge measurements taken over an interval of time.

27. The system as claimed in claim 26, further including an output device coupled to said energy transfer module for outputting a graphical representation of said energy transfer profile.

28. The system as claimed in claim 27, wherein the graphical representation of said energy transfer profile includes a battery state of charge over time and a graphical representation of battery temperature over time.

29. A system for modelling energy transfer for a cyclical application environment utilizing a battery as an energy source, said system comprising:
- a) means for receiving sensor data for the application environment, said sensor data being related to energy consumption during a cycle of the application environment;
- b) means for receiving one or more charge parameters for the battery including a charge schedule, the charge schedule defining times and time intervals during which the battery is available for charging;
- c) means for determining an energy transfer profile modeling the battery state of charge over time in future cycles of the application environment based upon said sensor data and said charge parameters, said energy profile determining means including means for determining one or more energy needs for the application environment and means for applying a charge return model based upon said charge parameters; and
- d) means for outputting the energy transfer profile;
- wherein said charge return model is constrained by the charge schedule.

30. The system as claimed in claim 29, further including means for receiving one or more application environment parameters, and said energy profile determining means being responsive to said application environment parameters.

31. The system as claimed in claim 29, wherein said means for determining the energy needs of the application environment includes means for obtaining a discharge value for the battery from said sensor data.

32. The system as claimed in claim 30, wherein said energy profile determining means includes means for incrementally calculating battery parameters and a battery state of charge over time based upon said energy needs and said charge return model.

33. The system as claimed in claim 32, wherein said means for calculating said battery state of charge over time includes incrementally calculating a charge returned to the battery as a result of said charge return model.

34. The system as claimed in claim 32, wherein said means for calculating battery parameters includes means for determining a change in said battery temperature based upon a difference between heat generated and heat dissipated.

35. The system as claimed in claim 34, wherein said charge return model is selected from a group including IVI, modified IVI, and controlled-feedback rapid charging.

36. The system as claimed in claim 29, wherein said sensor data includes voltage and current measurements taken over time for the battery.

37. The system as claimed in claim 36, further including means coupled to the battery for recording said sensor data with the battery operating in the application environment.

38. The system as claimed in the claim 37, wherein said recorded sensor data includes temperature measurements.

39. The system as claimed in claim 38, wherein said recorded sensor data includes discharge measurements taken over a time interval.

40. A computer program product having a computer-readable medium tangibly embodying computer executable instructions for modelling energy transfer for a cyclical application environment having a battery, said computer executable instructions comprising:
   a) computer executable instructions for receiving recorded sensor data for the application environment regarding energy consumption over time of a cycle of the application environment;
   b) computer executable instructions for receiving application environment parameters through a user input interface, including one or more charge parameters including a charge schedule, the charge schedule defining times and time intervals during which the battery is available for charging;
   c) computer executable instructions for generating an energy transfer profile modeling the battery state of charge over time in future cycles of the application environment based upon said sensor data and said application environment parameters, wherein said step of generating the energy transfer profile includes determining an energy requirement for the application environment and applying a charge return model based upon said charge parameters for the energy transfer profile; and
   d) computer executable instructions for outputting the energy transfer profile.

41. The computer program product as claimed in claim 40, wherein said computer executable instructions for determining an energy requirement for the application environment includes computer executable instructions for obtaining a measured discharge value for the battery from said sensor data.

42. The computer program product as claimed in claim 41, wherein said computer executable instructions for generating the energy transfer profile include computer executable instructions for calculating battery parameters and computer executable instructions for calculating a battery state of charge over time based upon said energy requirement and said charge return model.

43. The computer program product as claimed in claim 42, wherein said step of calculating said battery state of charge over time includes incrementally calculating a charge returned to the battery as a result of said charge return model constrained by said charge schedule.

44. The computer program product as claimed in claim 43, wherein said computer executable instructions for determining the energy transfer profile includes computer executable instructions for calculating a battery state of charge over time, and wherein said computer executable instructions for outputting said energy transfer profile includes computer executable instructions for producing a graphical representation of said battery state of charge over time.

45. The computer program product claimed in claim 44, wherein said graphical representation further includes a graphical representation of a battery temperature over time.

* * * * *

UNITED STATES PATENT AND TRADEMARK OFFICE
CERTIFICATE OF CORRECTION

| | |
|---|---|
| PATENT NO. | : 7,358,701 B2 |
| APPLICATION NO. | : 10/757220 |
| DATED | : April 15, 2008 |
| INVENTOR(S) | : Robert B. Field et al. |

Page 1 of 1

It is certified that error appears in the above-identified patent and that said Letters Patent is hereby corrected as shown below:

Column 13,
Line 62, insert --for-- between "transfer" and "a".

Signed and Sealed this

Twenty-first Day of October, 2008

JON W. DUDAS
*Director of the United States Patent and Trademark Office*